(12) United States Patent
Lee et al.

(10) Patent No.: US 8,011,086 B2
(45) Date of Patent: Sep. 6, 2011

(54) METHOD OF MANUFACTURING A COMPONENT-EMBEDDED PRINTED CIRCUIT BOARD

(75) Inventors: Doo-Hwan Lee, Suwon-si (KR);
Seung-Gu Kim, Suwon-si (KR);
Won-Cheol Bae, Pyeongtaek-si (KR);
Moon-Il Kim, Daeleon (KR); Jae-Kul Lee, Seoul (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 216 days.

(21) Appl. No.: 11/896,105

(22) Filed: Aug. 29, 2007

(65) Prior Publication Data
US 2008/0052906 A1 Mar. 6, 2008

(30) Foreign Application Priority Data
Aug. 30, 2006 (KR) .................. 10-2006-0083059

(51) Int. Cl.
*H05K 3/30* (2006.01)
*H05K 3/00* (2006.01)
*H05K 3/36* (2006.01)
*H05K 3/02* (2006.01)
*H01R 9/00* (2006.01)

(52) U.S. Cl. ................ 29/832; 29/829; 29/830; 29/841; 29/845; 29/847

(58) Field of Classification Search .............. 29/832, 29/829, 830, 841, 845, 847, 852
See application file for complete search history.

(56) References Cited

U.S. PATENT DOCUMENTS

| | | | |
|---|---|---|---|
| 5,832,599 A * | 11/1998 | Isaak | 29/840 |
| 6,204,089 B1 * | 3/2001 | Wang | 438/108 |
| 6,734,570 B1 * | 5/2004 | Archer | 257/786 |
| 6,884,650 B2 * | 4/2005 | Lee et al. | 438/51 |
| 6,989,606 B2 * | 1/2006 | Cheng et al. | 257/778 |
| 7,263,769 B2 * | 9/2007 | Morimoto et al. | 29/852 |

(Continued)

FOREIGN PATENT DOCUMENTS

CN 1366444 A 8/2002

(Continued)

OTHER PUBLICATIONS

Japanese Office Action dated Aug. 11, 2009 and issued in corresponding Japanese Patent Application 2007-221469.
Chinese Office Action mailed Jun. 19, 2009 and issued in corresponding Chinese Patent Application 200710142560.0.

*Primary Examiner* — A. Dexter Tugbang
*Assistant Examiner* — David Angwin

(57) ABSTRACT

A method of manufacturing a component-embedded printed circuit board is disclosed. By using a method of manufacturing a component-embedded printed circuit board, which includes: mounting a component on a first copper foil, on which a pattern is formed, such that the component is electrically connected with the pattern; stacking an insulation layer, which has a cavity formed in a position corresponding to the component, on a second copper foil, on which at least one conductive protrusion is formed; stacking together the first copper foil and the second copper foil such that the component is embedded in the cavity and the first copper foil and the second copper foil are electrically connected by the conductive protrusion; and removing portions of the first copper foil and the second copper foil to form circuit patterns, the circuit pattern formed from the first copper foil may be given a buried form, so that it is possible to manufacture a thin printed circuit board, when embedding a flip chip type component.

5 Claims, 6 Drawing Sheets

U.S. PATENT DOCUMENTS

| | | | |
|---|---|---|---|
| 7,351,915 B2 * | 4/2008 | Ahn et al. | 174/260 |
| 7,367,116 B2 * | 5/2008 | Yoshino et al. | 29/830 |
| 2002/0038509 A1 * | 4/2002 | Soejima et al. | 29/843 |
| 2003/0150101 A1 * | 8/2003 | Park et al. | 29/621 |
| 2004/0106294 A1 * | 6/2004 | Lee et al. | 438/691 |
| 2005/0073054 A1 * | 4/2005 | Kelly et al. | 257/778 |
| 2005/0194605 A1 * | 9/2005 | Shelton et al. | 257/99 |
| 2005/0239236 A1 * | 10/2005 | Oya | 438/123 |
| 2006/0198000 A1 * | 9/2006 | Park et al. | 359/10 |
| 2007/0114643 A1 * | 5/2007 | DCamp et al. | 257/678 |

FOREIGN PATENT DOCUMENTS

| | | |
|---|---|---|
| JP | 8-195560 | 7/1996 |
| JP | 2002-246501 | 8/2002 |
| JP | 2002-246753 | 8/2002 |
| JP | 2003-209201 | 7/2003 |
| JP | 2005-191549 | 7/2005 |
| JP | 2006-128519 | 5/2006 |

* cited by examiner

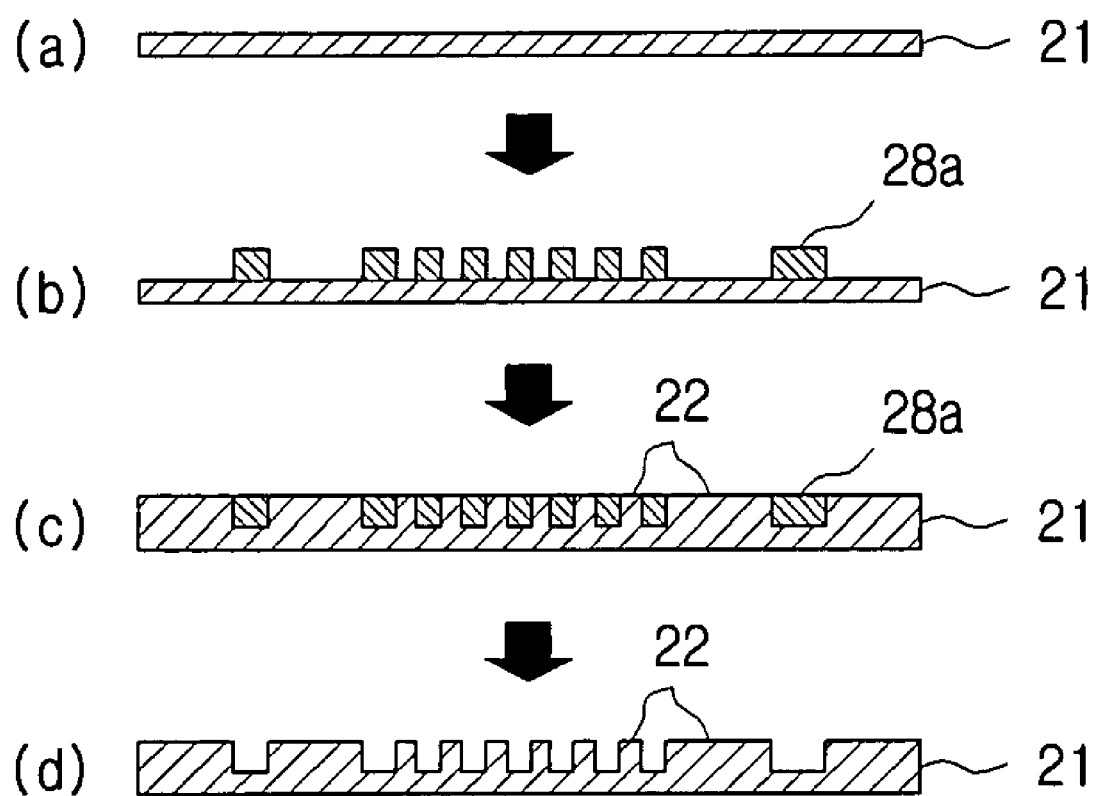

METHOD OF MANUFACTURING A COMPONENT-EMBEDDED PRINTED CIRCUIT BOARD

CROSS-REFERENCE TO RELATED APPLICATIONS

This application claims the benefit of Korean Patent Application No. 10-2006-0083059 filed with the Korean Intellectual Property Office on Aug. 30, 2006, the disclosure of which is incorporated herein by reference in its entirety.

BACKGROUND

1. Technical Field

The present invention relates to a printed circuit board, more particularly to a component-embedded printed circuit board.

2. Description of the Related Art

In step with the societal demands of the twenty first century for high-tech information and communication, electronics and electrical technology has seen rapid advances towards greater storage capacities, faster information processing and transmission, and more convenient information communication networks.

In particular, under the condition of finiteness in information transmission speeds, the method is being suggested of generating new functionalities by implementing the components to be as small as possible while increasing reliability, as a way to meet such requirements.

In fields requiring high-density thin mounting boards, such as general BGA (ball grid array) boards, and especially CSP's (chip scale packages), the trend is towards using flip chip mounting for higher performance and higher densities. In this case, while it is possible in the semiconductor manufacturing industry to convert the bump arrangement to area array types, there is a high burden caused by the costs of bumping processes, such as soldering, etc. Thus, the mounting method utilizing stud bumps is widely being used, with which package companies can perform bumping processes utilizing existing wire bonding equipment. For the mounting of electronic parts, methods of embedding parts after mounting the parts utilizing such stud bumps and of embedding parts after soldering have been proposed and are under active research and development, with production under way for some cases, albeit at a small scale.

In the research efforts regarding such boards for embedding, a key issue common to the various technologies is that, as the object of development is for a chip-sized package, a process is needed for minimizing the thickness of the board for embedding that ensures reliability and is inexpensive in costs.

SUMMARY

An aspect of the invention is to provide a way to embed a flip chip that ensures reliability and uses inexpensive processes, in which a technology of fundamentally decreasing the thickness of the board is employed, besides the scheme of reducing the thickness of the embedding board.

One aspect of the claimed invention provides a method of manufacturing a component-embedded printed circuit board, which includes: mounting a component on a first copper foil, on which a pattern is formed, such that the component is electrically connected with the pattern; stacking an insulation layer, which has a cavity formed in a position corresponding to the component, on a second copper foil, on which at least one conductive protrusion is formed; stacking together the first copper foil and the second copper foil such that the component is embedded in the cavity and the first copper foil and the second copper foil are electrically connected by the conductive protrusion; and removing portions of the first copper foil and the second copper foil to form circuit patterns.

The component may be a flip chip, and mounting the component may include coating the first copper foil with a photosensitive film; removing a portion of the photosensitive film; forming the pattern on the first copper foil by plating; and mounting the flip chip on the first copper foil such that the pattern and the flip chip are electrically connected.

Removing a portion of the photosensitive film may include: stacking a photosensitive film on the second copper foil; removing a portion of the photosensitive film; and removing portions of the exposed first copper foil and second copper foil to form the circuit patterns.

The conductive protrusion may be a sharp-ended conductive paste bump, which may be advantageous in electrically connecting the first copper foil and the second copper foil during the stacking process. Besides the sharp-ended conductive paste bump, a metal spike may be used for the conductive protrusion, in which case stacking the first copper foil and the second copper foil together may further include placing a conductive material between the metal spike and the first copper foil.

Additional aspects and advantages of the present invention will be set forth in part in the description which follows, and in part will be obvious from the description, or may be learned by practice of the invention.

BRIEF DESCRIPTION OF THE DRAWINGS

FIG. 2b is a process diagram illustrating a method of forming a pattern on a first copper foil according to a first disclosed embodiment of the invention.

DETAILED DESCRIPTION

The component-embedded printed circuit board according to certain embodiments of the invention will be described below in more detail with reference to the accompanying drawings, in which those components are rendered the same reference number that are the same or are in correspondence, regardless of the figure number, and redundant explanations are omitted.

Figure 1:
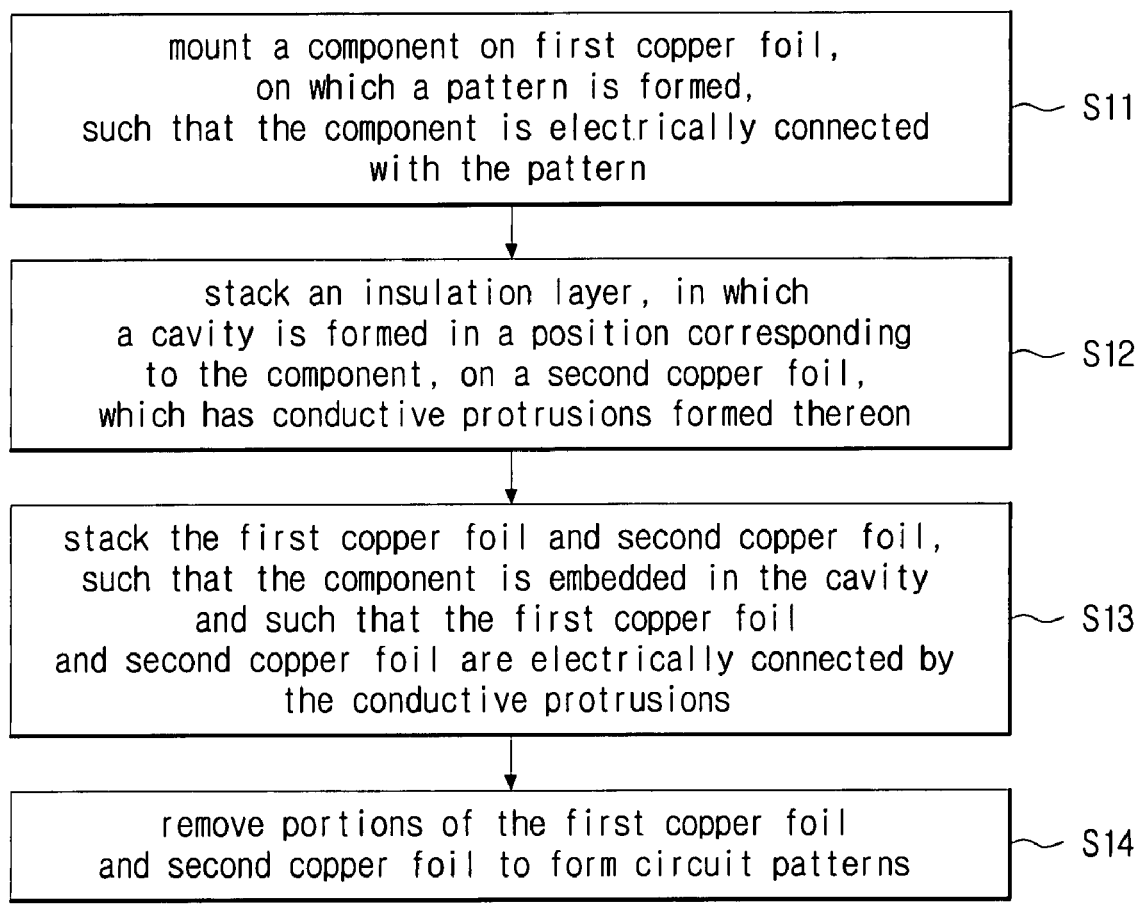
FIG. 1 is a flowchart illustrating the manufacture of a component-embedded printed circuit board according to a first disclosed embodiment of the invention.
Figure 2A:
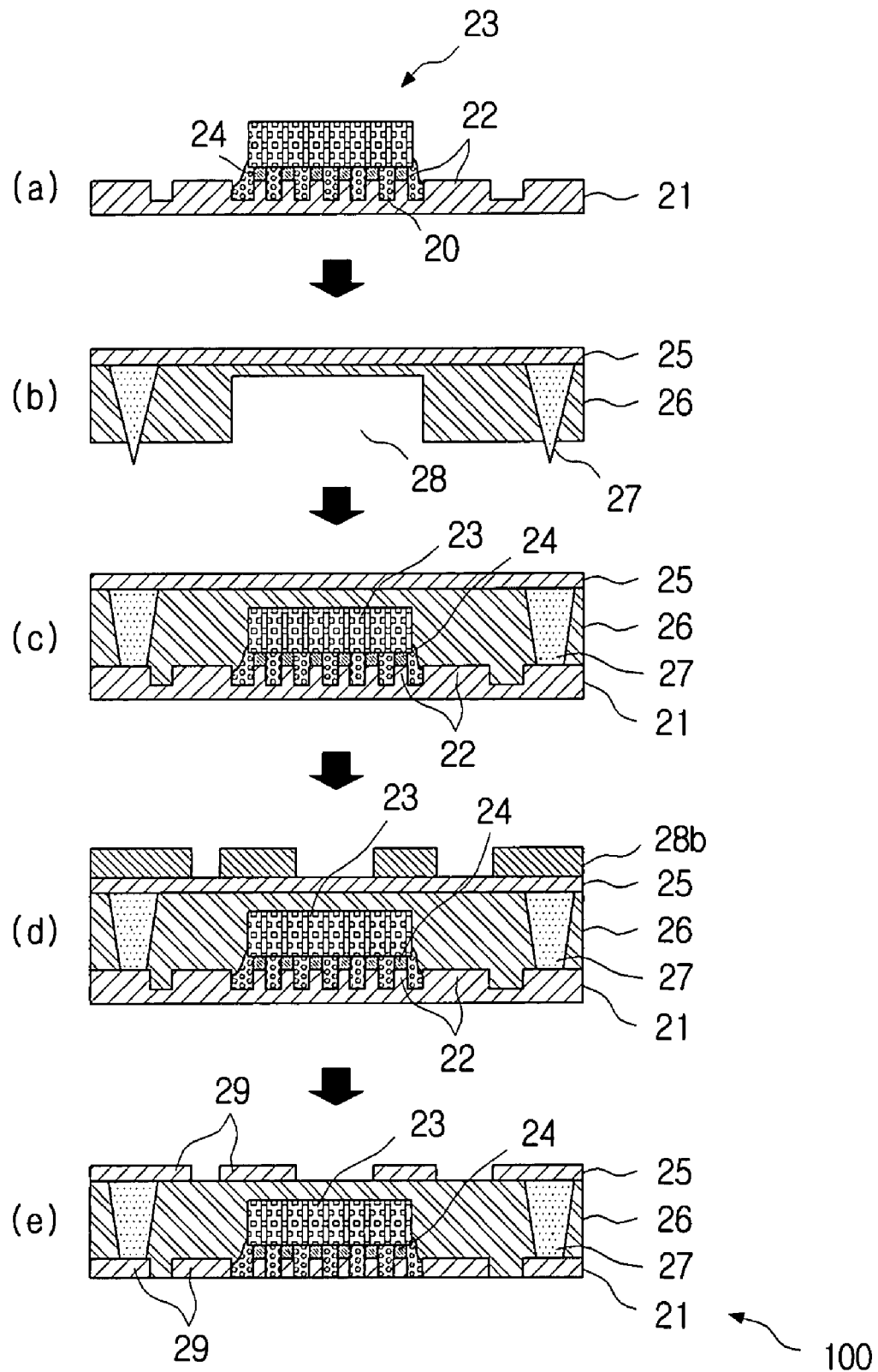
FIG. 2a is a process diagram illustrating the manufacture of a component-embedded printed circuit board according to a first disclosed embodiment of the invention.

FIG. 1 is a flowchart illustrating the manufacture of a component-embedded printed circuit board according to a first disclosed embodiment of the invention, and FIG. 2a is a process diagram illustrating the manufacture of a component-embedded printed circuit board according to a first disclosed embodiment of the invention. In FIG. 2a are illustrated a first copper foil 21, a pattern 22, a component 23, stud bumps 24, a second copper foil 25, an insulation layer 26, conductive protrusions 27, a cavity 28, circuit patterns 29, and a core board 100.

Operation S11 of FIG. 1 may include mounting the component 23 on the first copper foil 21, on which the pattern 22 is formed, such that the component 23 and the pattern 22 are electrically connected, where drawing (a) of FIG. 2a illustrates a corresponding process. As illustrated in (a) of FIG. 2a, the component 23 may be mounted on the first copper foil 21, on which the pattern 22 may be formed. The component 23 may have the form of a flip chip. Thus, stud bumps 24 may be formed on the lower terminals (not shown), to be electrically connected with the pattern 22 formed on the first copper foil 21. Here, non-conductive paste 20, etc., may be interposed between the component 23 and the first copper foil 21 for increased adhesion. Of course, common bumps may also be used in the place of stud bumps 24. When forming the pattern on the first copper foil 21, a fine pattern 22 may be required to be in correspondence with the stud bumps 24. One method of forming this fine pattern 22 will be described with reference to FIG. 2b.

FIG. 2b is a process diagram illustrating a method of forming a pattern 22 on a first copper foil 21 according to a first disclosed embodiment of the invention. As in (a) of FIG. 2b, the first copper foil 21 may first be prepared. It is advisable to determine the thickness of the first copper foil 21 in consideration of the amount removed later during the process of forming a circuit on the second copper foil 25. This is to implement a circuit through a simpler process, but since the first copper foil 21 may provide the surface on which the electronic part will be mounted, a thickness may obviously be desired that provides sufficient endurance during the plating and mounting processes. In consideration of etchability and stiffness while mounting a part, a carrier may be interposed that can support the copper foil. A carrier may be selected that is as thin as possible, because a portion of the first copper foil 21 is to be removed by an etching process. Afterwards, as in (b) of FIG. 2b, a dry film 28a may be stacked, and portions of the dry film 28a may be removed by exposing and developing processes in consideration of the portions where the pattern 22 is to be formed. Finally, as in (c) and (d) of FIG. 2b, plating may be performed and then the dry film 28a may be removed, to form the pattern 22 on the first copper foil 21. This method is a type of semi-additive process, which is currently widely used in printed circuit board processes as it provides an easy way to form fine patterns 22. However, in this embodiment of the claimed invention, the plating process may be performed on the first copper foil 21, not on a seed layer, to form the pattern 22, so that the pattern 22 can be formed more easily.

Operation S12 of FIG. 1 may include stacking one layer or several layers of the insulation layer 26, in which a cavity 28 is formed in a position corresponding to the component 23, onto the second copper foil 25, on which conductive protrusions 27 are formed. Drawing (b) of FIG. 2a illustrates a corresponding process. As illustrated in (b) of FIG. 2, the conductive protrusions 27 coupled to the second copper foil 25 protrude out through the insulation layer 26. In this embodiment, paste bumps or other conductive material may be used for the conductive protrusions 27. It is possible to form such paste bumps, etc., using the commonly known B2it (buried bump interconnection technology), etc., while conductive spikes, etc., may be formed using a semi-additive method, such as that described above. In order that the paste bumps or conductive spikes may easily and soundly be connected electrically with the first copper foil in the subsequent stacking process, the upper and lower connecting portions may be aligned, and the paste bumps or conductive spikes may be connected by pressing, by way of the stacking process.

The cavity 28 may be formed in the insulation layer 26. The cavity 28 may be formed in a position corresponding to the component 23 mounted on the first copper foil 21, to provide a space in which to embed the component 23, when the first copper foil 21 and second copper foil 25 are stacked later. While the cavity 28 may be formed first, with the insulation layer 26 preliminarily stacked on the second copper foil 25 afterwards, it is possible to form the cavity 28 after preliminarily stacking the insulation layer 26 on the second copper foil 25. While operation S12 of FIG. 1 may be performed after operation S11 in the case of this particular embodiment, the order of operations S11 and S12 is not important.

Operation S13 of FIG. 1 may include embedding the component 23 in the cavity 28 and stacking the first copper foil 21 and the second copper foil 25 such that the first copper foil 21 and second copper foil 25 are electrically connected by the conductive protrusions 27, where drawing (c) of FIG. 2a illustrates a corresponding process. The conductive protrusions 27 may have the form of conductive paste bumps, etc., as illustrated in drawing (b) of FIG. 2a, with portions protruding out of the insulation layer 26. Thus, when the first copper foil 21 and second copper foil 25 are stacked as in (c) of FIG. 2a, they may be electrically connected. Here, the first copper foil 21 and second copper foil 25 may be stacked such that there is no gap in-between.

Operation S14 of FIG. 1 may include removing portions of the first copper foil 21 and second copper foil 25 to form the circuit pattern 29, where drawings (d) and (e) of FIG. 2a illustrate corresponding processes. As in (d) of FIG. 2a, a photosensitive film 28b may be stacked on the second copper foil 25, and exposure and development may be performed in consideration of the portions where the circuit patterns 29 will be formed. When etching is performed afterwards, the exposed portions of the second copper foil 25 may be removed, as in (e) of FIG. 2a, while at the same time, a portion of the first copper foil 21 across all of its surface may be removed except for the circuit portion. As a result, the component-embedded core board 100 may be completed, as in (e) of FIG. 2a. This core board may be used alone as a printed circuit board. The circuit pattern 29 remaining after removing the first copper foil 21 may be buried inside an insulation layer 26 to become a buried circuit pattern 29. Thus, the overall thickness of the board may be reduced, while the stiffness may be increased.

Figure 3:
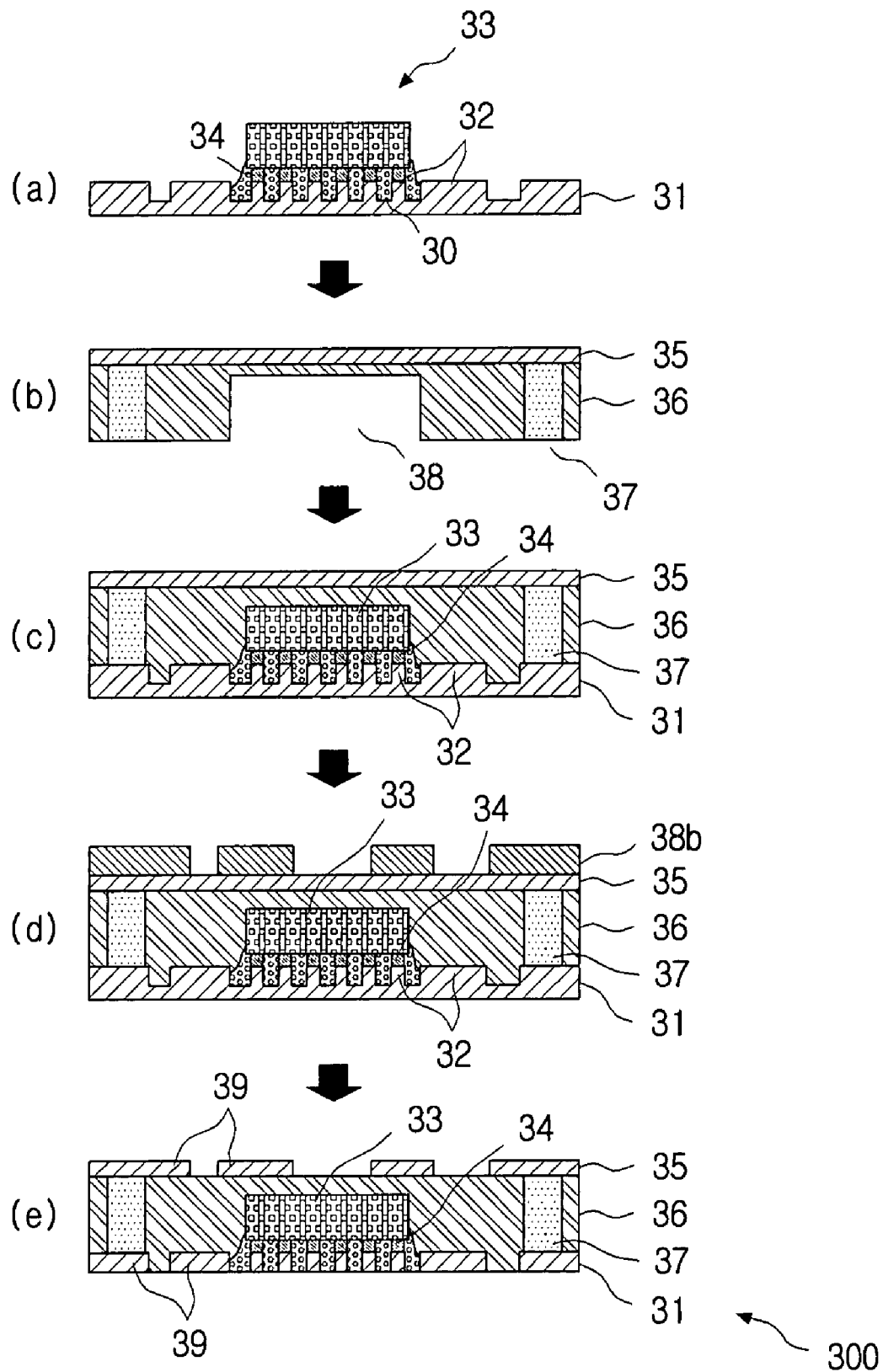
FIG. 3 is a process diagram illustrating the manufacture of a component-embedded printed circuit board according to a second disclosed embodiment of the invention.

FIG. 3 is a process diagram illustrating the manufacture of a component-embedded printed circuit board according to a second disclosed embodiment of the invention. In FIG. 3 are illustrated a first copper foil 31, a pattern 32, a component 33, stud bumps 34, a second copper foil 35, an insulation layer 36, metal spikes 37, a cavity 38, a photosensitive film 38b, circuit patterns 39, and a core board 300.

This embodiment is generally similar to the embodiment described with reference to FIG. 2a, but is different in that metal spikes 37 are used, instead of conductive paste bumps, for the conductive protrusions. While copper (Cu) may be used for the metal, the invention is not thus limited. When using metal spikes 37, a conductive material may be interposed between the metal spikes 37 and the pattern 32 during the process illustrated by (c) of FIG. 3, in order to implement a better electrical connection between the first copper foil 31 and the pattern 32 in the stacking process of drawing (c) in FIG. 3. Such conductive material may be a material that allows electrical connection between the upper and lower parts by just a stacking process, for which conductive paste, etc., may commonly used, as described earlier. The conductive material may connect the metal spikes 37 and the pattern 32 with a degree of reliability.

Figure 4:
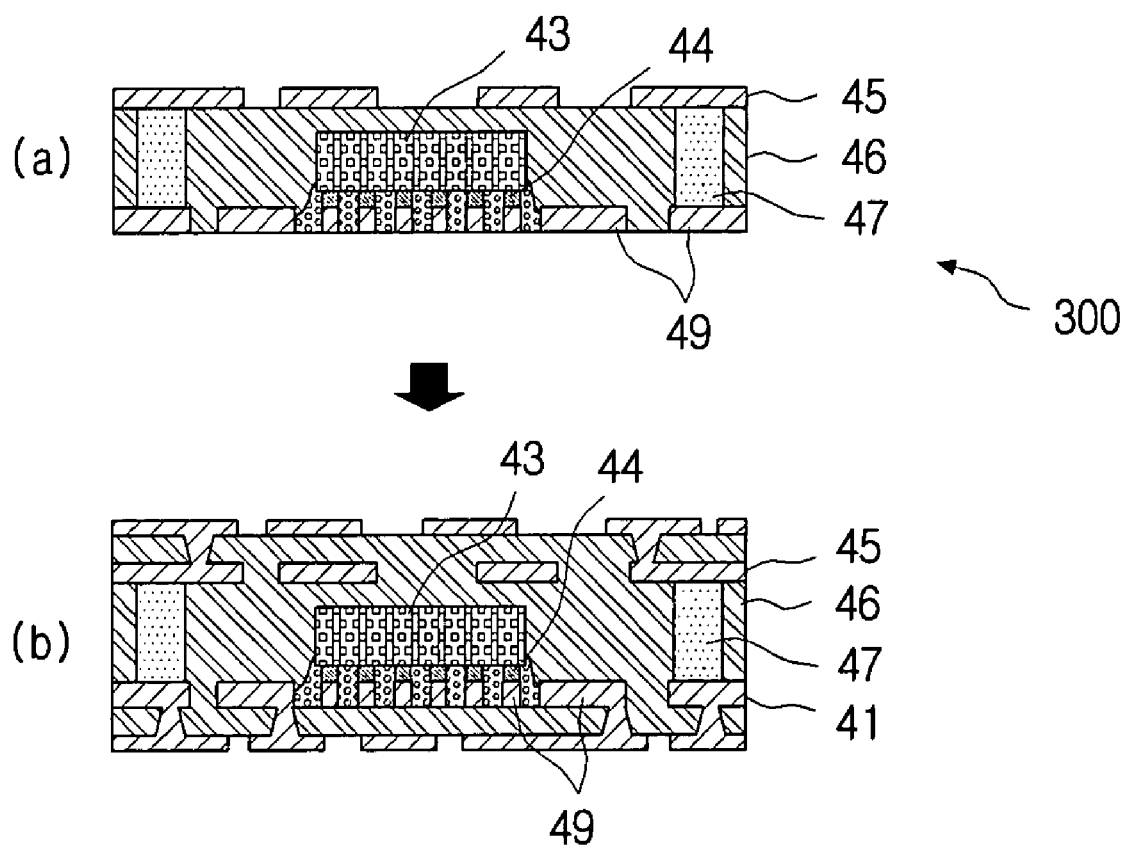
FIG. 4 is a process diagram illustrating the manufacture of a component-embedded printed circuit board according to a third disclosed embodiment of the invention.

FIG. 4 is a process diagram illustrating the manufacture of a component-embedded printed circuit board according to a third disclosed embodiment of the invention. In FIG. 4 are illustrated a component 43, stud bumps 44, a second copper foil 45, an insulation layer 46, metal spikes 47, circuit patterns 49, and a core board 300.

FIG. 4 is a process diagram for manufacturing a multi-layered printed circuit board, where a multi-layer printed circuit board may be manufactured by stacking an insulation layer and a circuit layer on each side of the core board 300 obtained by a process illustrated with reference to FIG. 3. This stacking is a common process, and thus will not be discussed in further detail.

Figure 5:
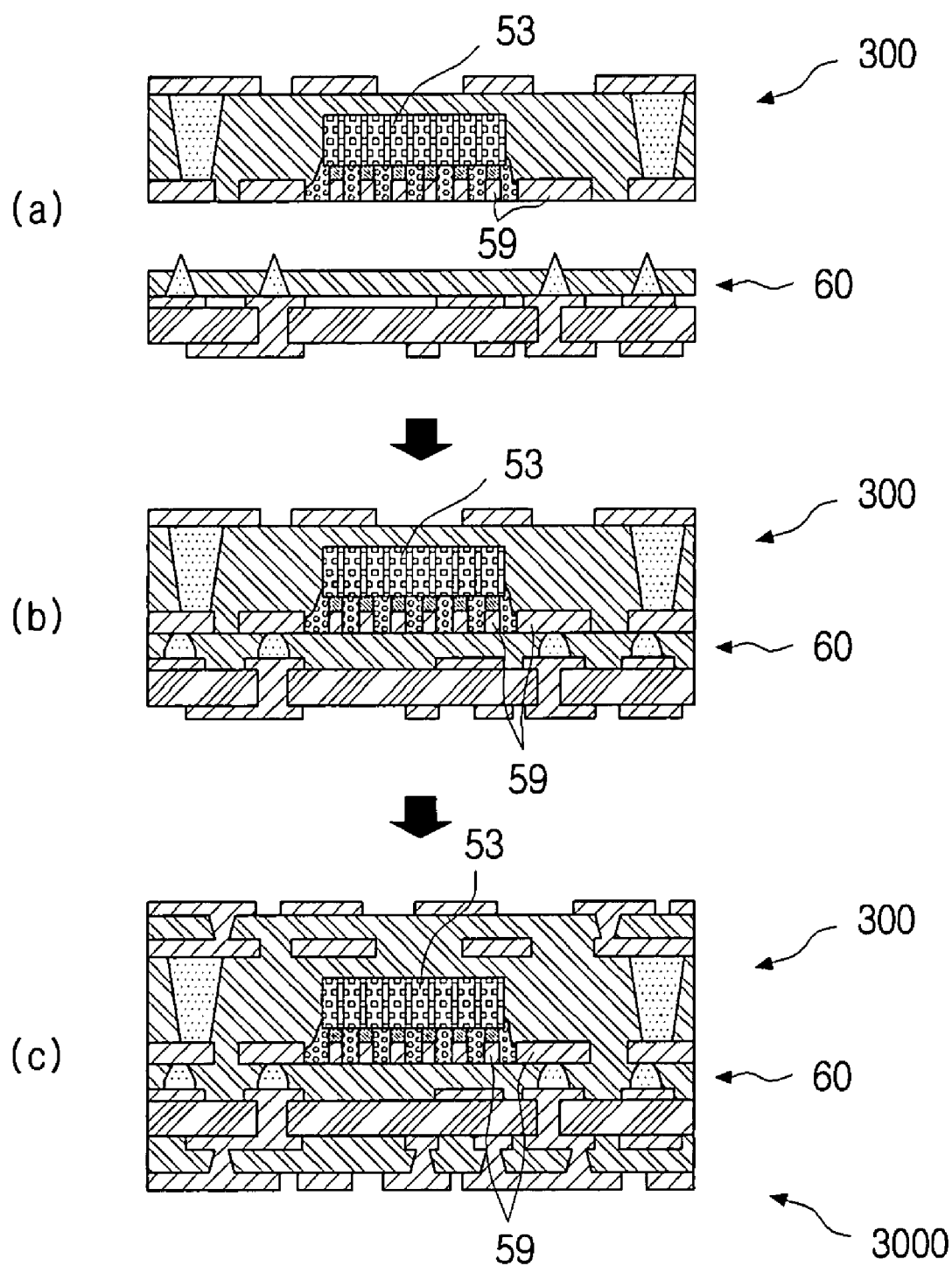
FIG. 5 is a process diagram illustrating the manufacture of a component-embedded printed circuit board according to a fourth disclosed embodiment of the invention.

FIG. 5 is a process diagram illustrating the manufacture of a component-embedded printed circuit board according to a fourth disclosed embodiment of the invention. In FIG. 5 are illustrated a component 53, circuit patterns 59, a core board 300, a bump board 60, and a printed circuit board 3000.

This embodiment gives an example of performing a stacking process of multiple layers on the core board 300 in the direction of the circuit pattern 59 electrically connected with the component 53. In general, relatively more of the circuit patterns 59 may be required at the portions where the component 53 is electrically connected, compared to those portions where it is not, and in order for the electrical signals of the circuit patterns 59 to be transferred adequately to the exterior, many pattern layers may be required underneath. Thus, a process may be performed of stacking multiple layers under the circuit pattern 59 to which the component 53 is connected, as shown in FIG. 5. Here, a multi-layered printed circuit board can be manufactured with even greater simplicity by interposing a bump board 60 and stacking collectively. As a result, a component-embedded printed circuit board 3000 may be manufactured, as in (c) of FIG. 5, which is asymmetrical with respect to the core board 300.

According to certain aspects of the invention as set forth above, the number of effective processes can be minimized when embedding components, so that process costs can be reduced.

Also, when embedding components, one layer of circuit can be given a buried form. Thus, not only is it simpler to apply fine circuits, but also the overall thickness of the printed circuit board can be decreased, and the stiffness can be increased.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a component-embedded printed circuit board, the method comprising:

mounting a component on a first copper foil having a first circuit pattern formed thereon, such that the component is electrically connected with the first circuit pattern;

after mounting the component, stacking an insulation layer, the insulation layer having a cavity, on to a second copper foil, the second copper foil having at least one conductive protrusion formed thereon, such that the conductive protrusion penetrates upper and lower surfaces of the insulation layer;

after stacking the insulation layer, stacking together the first copper foil and the second copper foil such that the component is embedded in the cavity and the first copper foil and the second copper foil are electrically connected by the conductive protrusion; and after stacking together the first copper foil and the second copper foil, removing the first copper foil except for the first circuit pattern such that the first circuit pattern is buried in the insulation layer, and removing a portion of the second copper foil such that a second circuit pattern is formed on the insulation layer, wherein the removing only includes stacking a photosensitive film on the second copper foil;
removing a portion of the photosensitive film; and
removing portions of the exposed first copper foil and second copper foil to form the circuit patterns by etching.

2. The method of claim 1, wherein the component is a flip chip, and the mounting comprises:

coating the first copper foil with a photosensitive film;
removing a portion of the photosensitive film;
forming the pattern on the first copper foil by plating; and
mounting the flip chip on the first copper foil such that the pattern and the flip chip are electrically connected.

3. The method of claim 1, wherein the conductive protrusion is a sharp-ended conductive paste bump.

4. The method of claim 1, wherein the conductive protrusion is a metal spike, and the stacking together further comprises interposing a conductive material between the metal spike and the first copper foil.

5. The method of claim 1, wherein the removing the first copper foil and the removing a portion of the second copper foil are performed at the same time.

\* \* \* \* \*

UNITED STATES PATENT AND TRADEMARK OFFICE
CERTIFICATE OF CORRECTION

| | | |
|---|---|---|
| PATENT NO. | : 8,011,086 B2 | Page 1 of 1 |
| APPLICATION NO. | : 11/896105 | |
| DATED | : September 6, 2011 | |
| INVENTOR(S) | : Doo-Hwan Lee et al. | |

It is certified that error appears in the above-identified patent and that said Letters Patent is hereby corrected as shown below:

Title Page, Column 1 item (75) (Inventors), Line 4, Delete "Daeleon" and insert -- Daejeon --, therefor.

Signed and Sealed this
Thirty-first Day of January, 2012

David J. Kappos
*Director of the United States Patent and Trademark Office*